United States Patent
Eom et al.

(10) Patent No.: US 9,980,393 B2
(45) Date of Patent: May 22, 2018

(54) PATTERN-FORMING METHOD FOR FORMING A CONDUCTIVE CIRCUIT PATTERN

(71) Applicant: ELECTRONICS AND TELECOMMUNICATIONS RESEARCH INSTITUTE, Daejeon (KR)

(72) Inventors: Yong Sung Eom, Daejeon (KR); Kwang-Seong Choi, Daejeon (KR); Hyun-cheol Bae, Daejeon (KR); Jung Hyun Noh, Daejeon (KR); Jong Tae Moon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 127 days.

(21) Appl. No.: 14/704,597

(22) Filed: May 5, 2015

(65) Prior Publication Data
US 2015/0237739 A1    Aug. 20, 2015

Related U.S. Application Data

(62) Division of application No. 13/611,220, filed on Sep. 12, 2012, now abandoned.

(30) Foreign Application Priority Data

Dec. 13, 2011   (KR) .......................... 10-2011-0133703

(51) Int. Cl.
*H05K 3/12* (2006.01)
*C25D 5/02* (2006.01)
(Continued)

(52) U.S. Cl.
CPC .............. *H05K 3/1216* (2013.01); *C25D 5/02* (2013.01); *H05K 1/09* (2013.01); *H05K 3/102* (2013.01);
(Continued)

(58) Field of Classification Search
CPC ........ C25D 5/02; H05K 3/1216; H05K 3/103; H05K 3/188; H05K 1/09; H05K 2203/0425; H05K 2201/0302
See application file for complete search history.

(56) References Cited

U.S. PATENT DOCUMENTS 4,000,045 A  * 12/1976  Rotzow ................. H05K 3/242
                                                             205/125
4,795,670 A    1/1989  Nishigaki et al.
(Continued)

FOREIGN PATENT DOCUMENTS

JP    H09-245522 A    9/1997
JP    2005-129424 A    5/2005
(Continued)

OTHER PUBLICATIONS

Matt Moynihan, "An Overview of Wet Chemistry Processing for the Manufacturing of Silicon Solar Cells", Circuitree Magazine, Jul. 2008.

*Primary Examiner* — Louis J Rufo
(74) *Attorney, Agent, or Firm* — Rabin & Berdo, P.C.

(57) ABSTRACT

A pattern-forming method for forming a conductive circuit pattern, the pattern-forming method including the steps of: preparing a pattern-forming composition composed of: Cu powder; solder particles for electrically coupling the Cu powder; a polymer resin; a deforming agent that is selected from among acrylate oligomer, polyglycols, glycerides, polypropylene glycol, dimethyl silicon, simethinecone, tributyl phosphare, and polymethylsiloxane, and that increases bonding force between the Cu powder and the
(Continued)

solder particles; a curing agent; and a reductant; forming a circuit pattern by printing the pattern-forming composition on a substrate; heating the circuit pattern at a temperature effective to cure the pattern-forming composition and provide the conductive circuit pattern; and electrolytically plating a metal layer onto the conductive circuit pattern. A circuit pattern having superior conductivity is formed at low cost.

15 Claims, 3 Drawing Sheets

(51) Int. Cl.
    *H05K 3/18*         (2006.01)
    *H05K 3/10*         (2006.01)
    *H05K 1/09*         (2006.01)

(52) U.S. Cl.
    CPC ..... *H05K 3/188* (2013.01); *H05K 2201/0302* (2013.01); *H05K 2203/0425* (2013.01)

(56) References Cited

U.S. PATENT DOCUMENTS

| | | | |
|---|---|---|---|
| 5,045,236 A | | 9/1991 | Tsunaga et al. |
| 5,376,403 A | * | 12/1994 | Capote ................. B22F 3/1035 |
| | | | 148/24 |
| 5,904,782 A | * | 5/1999 | Diep-Quang ........ H05K 3/3484 |
| | | | 148/23 |
| 2002/0127406 A1 | * | 9/2002 | Sachdev .............. C08G 59/306 |
| | | | 428/413 |
| 2004/0078968 A1 | * | 4/2004 | Wong ...................... C25D 5/02 |
| | | | 29/847 |
| 2010/0263917 A1 | | 10/2010 | Heo et al. |
| 2012/0037409 A1 | * | 2/2012 | Yamaguchi ............. H01B 1/22 |
| | | | 174/257 |

FOREIGN PATENT DOCUMENTS

| | | |
|---|---|---|
| JP | 2010-013726 A | 1/2010 |
| KR | 10-2008-0026165 A | 3/2008 |
| KR | 10-2010-0013133 A | 2/2010 |
| KR | 10-2010-0046285 A | 5/2010 |
| KR | 10-2010-0062883 A | 6/2010 |

\* cited by examiner

Density of current : 40mA/cm²
Time : 10min

PATTERN-FORMING METHOD FOR FORMING A CONDUCTIVE CIRCUIT PATTERN

CROSS-REFERENCE TO RELATED APPLICATIONS

This is a division of application Ser. No. 13/611,220, filed Sep. 12, 2012. Furthermore, this application is based on and claims priority from Korean Patent Application No. 10-2011-0133703, filed on Dec. 13, 2011, with the Korean Intellectual Property Office, the present disclosure of which is incorporated herein in its entirety by reference.

FIELD OF INVENTION

The present invention relates to a composition for forming a conductive circuit pattern and a method for forming a conductive circuit pattern on a substrate using the same.

BACKGROUND OF THE INVENTION

In general, a conductive circuit pattern is formed on a substrate through an expose process or an etching process using a photomask. However, there is a limit in forming a complicated and micro circuit pattern by using a photomask.

Accordingly, in order to conveniently form a micro circuit pattern, it has been suggested that a paste containing Au or Ag is applied on a substrate, and then is cured to form a circuit pattern. The related arts are Korean Patent Application Publication No. 2008-0026165 entitled "A silver paste composition, a method for forming a conductive pattern using the same and a conductive pattern thereof" and Korean Patent Application Publication No. 2010-0046285 entitled "Silver microparticle-containing composition, a method for forming the same, a method for forming a silver microparticle, and a paste having silver microparticle."

However, precious metals, such as Au or Ag, are expensive. Accordingly, the use of a paste that contains precious metals causes a problem of incurring excessive costs for forming a circuit pattern.

SUMMARY

The present invention has been made to solve the above-mentioned problem. It is an objective of the present invention to provide a pattern-forming method and a pattern-forming composition in order to form a micro circuit pattern at low cost.

In order to achieve the afore-mentioned objective, the present invention provides a pattern-forming composition, comprising: Cu powders; a solder for electrically coupling the Cu powders; a polymer resin; a curing agent; and a reductant.

Here, the solder is at least two selected from the group consisting of Sn, Bi, In, Ag, Pb and Cu.

Further, said pattern-forming composition may further comprise Ag powders.

Meanwhile, the present invention provides a pattern-forming method, comprising the steps of: preparing a pattern-forming composition comprising Cu powders, a solder for electrically coupling the Cu powders, a polymer resin, a curing agent and a reductant; and forming a circuit pattern by printing the pattern-forming composition on the substrate.

Here, the pattern-forming method may further comprise the step of electrolytic-plating the formed circuit pattern.

In addition, the present invention provides a conductive circuit pattern formed by the aforementioned pattern-forming method.

EFFECT OF THE INVENTION

The present invention can reduce the costs for forming a pattern, because a circuit pattern is formed by using a pattern-forming composition that contains inexpensive Cu. Further, the present invention can provide a circuit pattern having superior conductivity, because the composition according to the present invention comprises a solder in order to increase the electric coupling of Cu.

DETAILED DESCRIPTION

Hereinafter, the present invention is explained in detail.

1. Pattern-Forming Composition

The present invention relates to a pattern-forming composition comprising Cu powders, a solder, a polymer resin, a curing agent and a reductant.

The Cu powder contained in the composition of the present invention exhibits conductivity. The shape of the Cu powder is not specifically limited, but may be a spherical shape or a flake shape. Further, the diameter of the used Cu powder is not specifically limited, but is preferably 2-10 μm.

In consideration of conductivity of the circuit pattern and workability for forming a pattern, a ratio of the Cu powder contained in the composition is preferably 30-50 wt % (more preferably, 35-48 wt %) based on 100 wt % of the composition.

The solder contained in the composition of the present invention electrically couples Cu powders (for example, a first Cu power and a second Cu powder) in order to increase conductivity of the circuit pattern, and is preferably a mixture of at least two selected from the group consisting of Sn, Bi, In, Ag, Pb and Cu, although available substances are not specifically limited. Among these substances, it is more preferable that the solder is selected from the group consisting of a mixture of Sn and Bi (60Sn/40Bi), a mixture of In and Sn (52In/48Sn), a mixture of In and Ag (97In/3Ag), a mixture of Bi, Sn and Ag (57Bi/42Sn/1Ag), a mixture of Bi and Sn (58Bi/42Sn), a mixture of Bi, Pb and Sn (52Bi/32Pb/16Sn) and a mixture of Sn, Ag and Cu (96.5Sn/3Ag/0.5Cu) (based on 100% solder).

Figure 1:
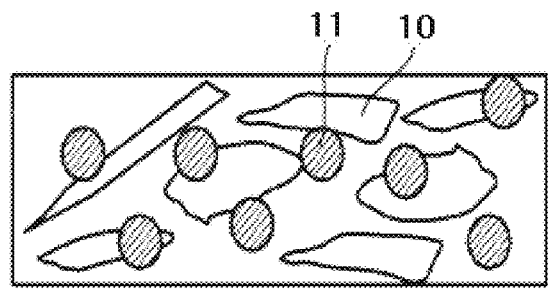
FIG. 1 illustrates a state that the pattern-forming composition according to the present invention is cured.

The shape of the solder is not specifically limited, but may be a spherical shape. Further, the diameter of the solder is not specifically limited, but is preferably 2-11 μm. Such a solder is disposed in a space among the Cu powders and couples the Cu powders separated from one another. Thus, when a circuit pattern is formed by the composition of the present invention, conductivity of the circuit pattern can be increased (see FIG. 1).

In consideration of conductivity of the circuit pattern, a ratio of the solder contained in the composition of the present invention is preferably 30-50 wt % (more preferably, 35-48 wt %) based on 100 wt % of composition.

The polymer resin contained in the composition of the present invention functions as a binder. Substances available as a polymer resin are not specifically limited, but are preferably selected from the group consisting of diglycidyl ether of bisphenol A, tetraglycidyl 4,4'-diaminodiphenyl methane, tri diaminodiphenyl methane, isocyanate and bis-maleimide.

In consideration of conductivity of the circuit pattern and workability when forming a pattern, a ratio of the polymer resin contained in the composition of the present invention is preferably 1-20 wt % (more preferably, 2-16 wt %) based on 100 wt % of composition.

The curing agent contained in the composition of the present invention, amine-based and anhydride-based are available. Here, unlimited examples of amine-based curing agents are m-phenylenediamine (MPDA), diaminodiphenyl methane (DDM) and diaminodiphenyl sulphone (DDS). Unlimited examples of anhydride-based curing agents are methyl nadic anhydride (MNA), dodecenyl succinic anhydride (DDSA), maleic anhydride (MA), succinic anhydride (SA), methyl tetrahydrophthalic anhydride (MTHPA), hexahydrophthalic anhydride (HHPA), tetrahydrophthalic anhydride (THPA) and pyromellitic dianhydride (PMDA). When anhydride-based curing agents are used, the solder may also function as a curing catalyst agent to accelerate the curing of the composition.

The equivalent ratio of the curing agent may have 0.4-1.2 with respect to the polymer resin. Particularly, the equivalent ratio of the functional group of the curing agent to the functional group of a monomer comprising the polymer resin ranges between 0.4 and 1.2.

Meanwhile, in consideration of workability when forming a circuit pattern, the ratio of the curing agent contained in the composition of the present invention is preferably 1-15 wt % (more preferably, 1.5-11.5 wt %) based on 100 wt % of composition.

The reductant contained in the composition of the present invention removes oxides (which are typically formed by the Cu powder) from the composition. Although substances available as a reductant are not specifically limited, what comprises a carboxyl group (-COOH) can be used. Particularly, unlimited examples of the reductant are a glutaric acid, a malic acid, an azelaic acid, an abietic acid, an adipic acid, an ascorbic acid, an acrylic acid and a citric acid.

In consideration of wetting property and reduction property between the Cu powder and the solder, the ratio of the reductant contained in the composition of the present invention is preferably 0.1-5 wt % (more preferably, 0.4-3 wt %) based on 100 wt % of composition.

The composition of the present invention may further comprise Ag powders in order to increase conductivity of the circuit pattern. The shape of the used Ag powder is not specifically limited, but may be a spherical shape or a flake shape. Further, the diameter of the Ag powder is not specifically limited, but is preferably 2-10 μm.

In consideration of conductivity of the circuit pattern and the costs, the ratio of the Ag powder contained in the composition of the present invention is preferably 0.1-15 wt % based on 100 wt % of composition.

In addition, the composition of the present invention may further comprise a curing catalyst agent in order to accelerate the curing reaction and a deforming agent in order to increase bonding force between the Cu powder and the solder and wetting property.

Although substances available as the curing catalyst agent contained in the composition of the present invention are not specifically limited, unlimited examples are benzyl dimethyl amine (BDMA), boron trifluoride monoethylamine complex (BF3-MEA), dimethylamino methyl phenol-30 (DMP-30), dimethyl benzol amine (DMBA) and methyl iodide.

Although substances available as the deforming agent contained in the composition of the present invention are not specifically limited, unlimited examples are acrylate oligomer, polyglycols, glycerides, polypropylene glycol, dimethylsilicon, simethinecone, tribubyl phosphate and polydimethylsiloxane.

In consideration of conductivity of the circuit pattern and workability when forming a pattern, the ratio of the curing catalyst agent and the deforming agent that can be further contained in the composition of the present invention is preferably 0.01-0.1 wt % (more preferably, 0.01-0.078 wt %) based on 100 wt % of composition.

2. A Pattern-Forming Method and a Conductive Circuit Pattern

The present invention provides a circuit-pattern forming method using the composition stated above and a conductive circuit pattern formed therefrom, as explained below with reference to the drawings.

First, prepare a pattern-forming composition comprising Cu powders, a solder for electrically coupling the Cu powders, a polymer resin, a curing agent and a reductant. Herein, the description of the pattern-forming composition will be omitted, because it is the same as stated above.

Figure 2:
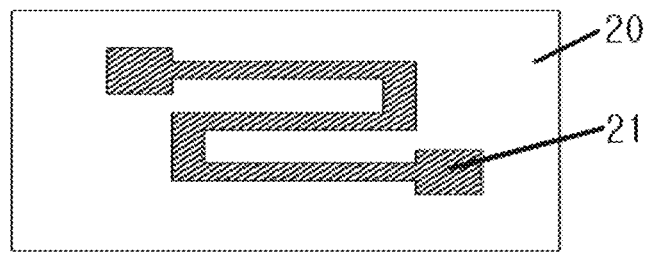
FIGS. 2 to 5 illustrate the pattern-forming method according to the present invention.
Figure 3:

Once the composition is prepared, the composition is printed on the substrate (20) to form a conductive circuit pattern (21) (see FIGS. 2 and 3). Although substances available as the substrate (20) are not specifically limited, a flexible substrate, a ceramic substrate and a silicon substrate can be used. Further, although a method for printing the circuit pattern (21) is not specifically limited as long as it is known in the relevant technical field, a screen printing can be applied.

Figure 4:
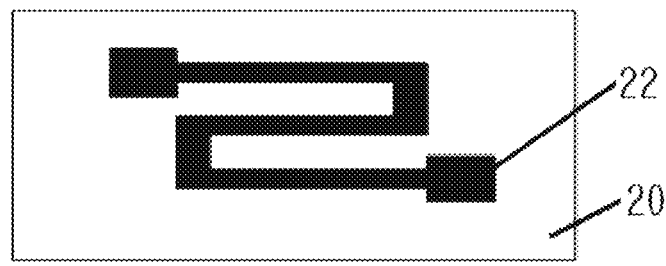
Figure 5:
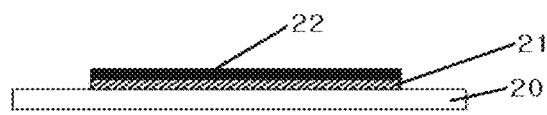

Meanwhile, the patter-forming method may further comprise a step of electrolytic-plating (22) the formed circuit pattern in order to increase the electrical connection force of the formed circuit pattern (21) and effectively perform a subsequent soldering process (see FIGS. 4 and 5). Particularly, after soaking the substrate (20) on which the circuit pattern (21) is formed into the electrolytic-plated solution, the current is applied for a certain hour to electroplate the circuit pattern (21). As the electrolytic-plated solution, metals, such as Cu, Ni or Au, can be used. The time for soaking the substrate (20) into the solution and the magnitude of the applied current can be adjusted depending on the thickness to be plated (the thickness plated on the circuit pattern board).

Through such processes, the present invention can easily form a circuit pattern having superior conductivity and uniform thickness at lower costs.

The present invention is described in detail by examples below. However, the scope of the present invention is not limited to the examples, since these examples are provided to particularly describe the present invention.

EXAMPLE

1. Preparation of a Pattern-Forming Composition

A composition was prepared by mixing 40 wt % of Cu flake having a diameter of 3 μm, a mixture 38 wt % of 58% of Sn and 42% of Bi as a solder, 12 wt % of diglycidyl ether bisphenol A as a polymer resin, 7.94 wt % of diamino diphenyl sulfone as a curing agent, 2 wt % of malic acid as a reductant and 0.06 wt % of boron trifluoride monoethylamine complex as a curing catalyst agent.

2. Forming a Conductive Pattern

Figure 6:
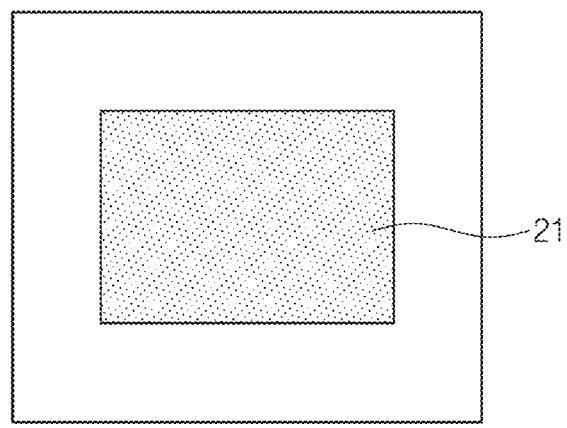
FIGS. 6 to 8 illustrate observation of the formed circuit pattern in the examples of the present invention.
Figure 7:
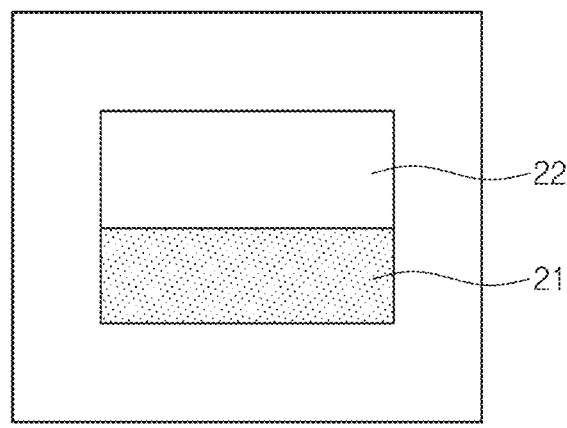

After applying the composition was prepared above, on the substrate (size of 10 mm×10 mm) using a screen printing, the composition is heated up to be 180° C. under the heating condition of 70° C./min or higher and was cured for about 5 minutes, thereby forming a conductive circuit pattern (see FIG. 6).

The lower part (10 mm×5 mm) of the circuit pattern formed in the size of 10 mm×10 mm was covered with a tape and the upper part (10 mm×5 mm) thereof was soaked into the electrolytic-plated solution, thereby conducting an additional electrolytic-plating. For the additional electrolytic-plating, Cu electrolytic-plated solution of 38° C. was used. The additional electrolytic-plating was conducted by applying the current density of 40 mA/cm$^2$ for ten minutes.

Experimental Example

1. Measurement of Conductivity

In the above example, the thickness and conductivity of the circuit pattern prior to the electrolytic-plating were measured using the known method in the relevant technical field. The measurement results showed that the thickness of the formed circuit pattern was about 65 μm and the electrical resistance of the corners in the diagonal line was about 0.4 Ω.

2. Photographing Images of the Electrolytic-plated Circuit Pattern

Figure 8:
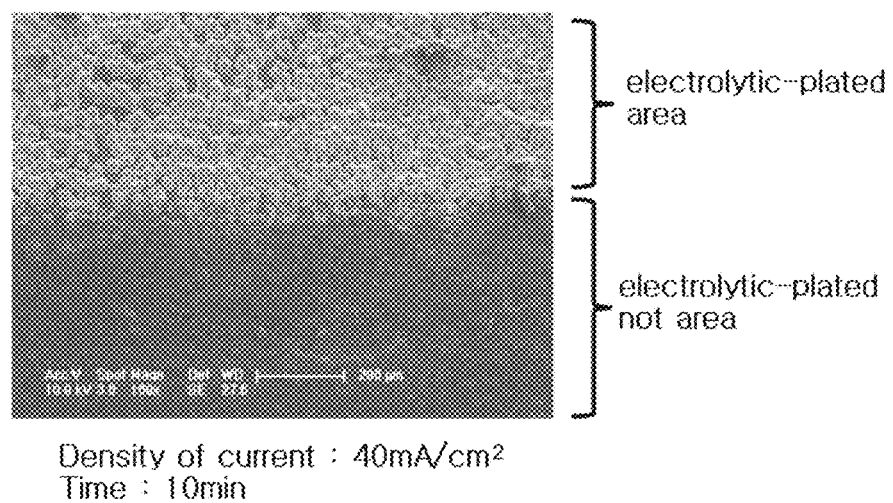

In the above example, the electrolytic-plated substrate was photographed using a scanning electron microscope (SEM) and the results are shown in FIG. 8 below. With reference to FIG. 8, it can be confirmed that the substrate was electrolytic-plated well.

REFERENCE NUMBERS

10: Cu flake
11: solder
20: substrate
21: circuit pattern
22: electrolytic-plating

What is claimed is:

1. A pattern-forming method for forming a conductive circuit pattern, the pattern-forming method comprising the steps of:
   (a) preparing a pattern-forming composition comprised of:
      Cu powder;
      solder particles comprised of at least one metal that is effective to electrically couple with the Cu powder;
      a polymer resin comprised of a material effective as a binder
      a deforming agent comprised of a material that is effective to increase bonding force between the Cu powder and the solder particles and that is selected from the group consisting of acrylate oligomer, polypropylene glycol, dimethyl silicon, simethinecone, tributyl phosphate, and polymethylsiloxane;
      a curing agent comprised of a material that is effective to cure the polymer resin; and
      a reductant comprised of a material that is effective to reduce oxide formation;
   (b) printing the pattern-forming composition on a substrate to form a circuit pattern;
   (c) heating the circuit pattern at a temperature effective to (i) melt the solder particles and cause electrical coupling between the Cu powder and the solder particles so that electrical conductivity is increase, and (ii) cure the pattern-forming composition and provide said circuit pattern; and
   (d) electrolytically plating a metal layer onto the conductive circuit pattern;
   wherein the pattern-forming composition further comprises a curing catalyst agent to accelerate curing the pattern-forming composition, and wherein the curing catalyst agent is selected from the group consisting of boron trifluoride monoethylamine comples (BF3-MEA), fimethyl benzol amine (DMBA), and methyl iodide.

2. The pattern-forming method as claimed in claim 1, wherein the Cu powder has a diameter ranging from 2 to 10 μm.

3. The pattern-forming method as claimed in claim 1, wherein the solder particles comprise at least two elements selected from the group consisting of Sn, Bi, In, Ag, Pb and Cu.

4. The pattern-forming method as claimed in claim 1, wherein the solder particles comprise a mixture of metals selected from the group consisting of a mixture of Sn and Bi, a mixture of In and Sn, a mixture of In and Ag, a mixture of Bi, Sn and Ag, a mixture of Bi and Sn, a mixture of Bi, Pb and Sn, and a mixture of Sn, Ag and Cu.

5. The pattern-forming method as claimed in claim 1, wherein the pattern-forming composition further comprises Ag powder.

6. The pattern-forming method as claimed in claim 1, wherein the metal layer that is electrolytically plated on the conductive circuit pattern is comprised of Cu, Ni or Au.

7. The pattern-forming method as claimed in claim 1, further comprising covering a part of the circuit pattern with a tape to form a non-electroplated portion of the circuit pattern.

8. A pattern-forming method for forming a conductive circuit pattern, the pattern-forming method comprising the steps of:
   (a) preparing a pattern-forming composition comprised of:
      from 30 to 50 wt % of Cu powder;
      from 30 to 50 wt % of solder particles comprised of at least one metal that is effective to electrically couple with the Cu powder;
      from 1 to 20 wt % of a polymer resin comprised of a material effective as a binder from 1 to 15 wt % of a curing agent comprised of a material that is effective to cure the polymer resin; and
      from 0.1 to 5 wt % a reductant comprised of a material that is effective to reduce oxide formation;
      from 0.01 to 0.1 wt % of a deforming agent comprised of a material that is effective to increase bonding force between the Cu powder and the solder particles
   (b) printing the pattern-forming composition on a substrate to form a circuit pattern;
   (c) heating the circuit pattern at a temperature effective to (i) melt the solder particles and cause electrical coupling between the Cu powder and the solder particles so that electrical conductivity is increase, and (ii) cure the pattern-forming composition and provide said circuit pattern; and
   (d) electrolytically plating a metal layer onto the conductive circuit pattern;
   wherein the pattern-forming composition further comprises a curing catalyst agent present in an amount effective to accelerate curing of the pattern-forming composition, and wherein the curing catalyst agent is selected from the group consisting of boron trifluoride monoethylamine comples (BF3-MEA), fimethyl benzol amine (DMBA), and methyl iodide.

9. The pattern-forming method as claimed in claim 8, wherein the deforming agent is selected from the group consisting of acrylate oligomer, polypropylene glycol, dimethyl silicon, simethinecone, tributyl phosphate, and polymethylsiloxane.

10. The pattern-forming method as claimed in claim 8, wherein the Cu powder has a diameter ranging from 2 to 10 μm.

11. The pattern-forming method as claimed in claim 8, wherein the solder particles comprise at least two elements selected from the group consisting of Sn, Bi, In, Ag, Pb and Cu.

12. The pattern-forming method as claimed in claim 8, wherein the solder particles comprise a mixture of metals selected from the group consisting of a mixture of Sn and Bi, a mixture of In and Sn, a mixture of In and Ag, a mixture of Bi, Sn and Ag, a mixture of Bi and Sn, a mixture of Bi, Pb and Sn, and a mixture of Sn, Ag and Cu.

13. The pattern-forming method as claimed in claim 8, wherein the pattern-forming composition further comprises from 0.1 to 15 wt % of Ag powder.

14. The pattern-forming method as claimed in claim 8, wherein the metal layer that is electrolytically plated on the conductive circuit pattern is comprised of Cu, Ni or Au.

15. The pattern-forming method as claimed in claim 8, further comprising covering a part of the circuit pattern with a tape to form a non-electroplated portion of the circuit pattern.

\* \* \* \* \*